US008338898B2

(12) United States Patent
Schrank et al.

(10) Patent No.: US 8,338,898 B2
(45) Date of Patent: Dec. 25, 2012

(54) MICRO ELECTRO MECHANICAL SYSTEM (MEMS) MICROPHONE HAVING A THIN-FILM CONSTRUCTION

(75) Inventors: Franz Schrank, Graz (AT); Martin Schrems, Eggersdorf (AT)

(73) Assignee: Austriamicrosystems AG, Unterpremstatten (AT)

(*) Notice: Subject to any disclaimer, the term of this patent is extended or adjusted under 35 U.S.C. 154(b) by 1276 days.

(21) Appl. No.: 11/792,515

(22) PCT Filed: Oct. 12, 2005

(86) PCT No.: PCT/EP2005/010974
§ 371 (c)(1),
(2), (4) Date: Apr. 28, 2008

(87) PCT Pub. No.: WO2006/061058
PCT Pub. Date: Jun. 15, 2006

(65) Prior Publication Data
US 2009/0041270 A1 Feb. 12, 2009

(30) Foreign Application Priority Data
Dec. 6, 2004 (DE) ......................... 10 2004 058 879

(51) Int. Cl.
*H01L 29/82* (2006.01)

(52) U.S. Cl. ........ 257/419; 257/415; 257/416; 257/418; 257/E29.324

(58) Field of Classification Search .............. 438/48–53; 257/415–419; 381/174–175
See application file for complete search history.

(56) References Cited

U.S. PATENT DOCUMENTS

| | | | | |
|---|---|---|---|---|
| 5,490,220 | A | 2/1996 | Loeppert | |
| 5,573,679 | A | 11/1996 | Mitchell et al. | |
| 5,659,195 | A | 8/1997 | Kaiser et al. | |
| 5,889,872 | A | 3/1999 | Sooriakumar et al. | |
| 6,178,249 | B1 | 1/2001 | Hietanen et al. | |
| 6,500,760 | B1 | 12/2002 | Peterson et al. | |
| 6,522,762 | B1 | 2/2003 | Mullenborn et al. | |
| 6,732,588 | B1 | 5/2004 | Mullenborn et al. | |
| 6,743,654 | B2 | 6/2004 | Coffa et al. | |
| 2002/0106828 | A1 | 8/2002 | Loeppert | |
| 2003/0128854 | A1 | 7/2003 | Mullenborn et al. | |
| 2005/0089180 | A1* | 4/2005 | Saeki et al. | 381/174 |
| 2005/0123155 | A1* | 6/2005 | Song et al. | 381/174 |

FOREIGN PATENT DOCUMENTS

| | | |
|---|---|---|
| EP | 1 244 332 | 1/2002 |
| EP | 1 191 810 | 3/2002 |
| EP | 1 244 332 A2 | 9/2002 |
| WO | WO 01/19133 | 3/2001 |
| WO | WO 03/038449 | 5/2003 |
| WO | WO 03/045110 | 5/2003 |
| WO | WO 03/045110 A1 | 5/2003 |
| WO | WO 2004/008522 | 1/2004 |
| WO | WO 2004/008522 A2 | 1/2004 |

OTHER PUBLICATIONS

The Official Office Action received in corresponding British Application No. GB 0709385.9.

* cited by examiner

*Primary Examiner* — Dung A. Le
(74) *Attorney, Agent, or Firm* — Cozen O'Connor

(57) ABSTRACT

An MEMS microphone is bonded onto the surface of an IC component containing at least one integrated circuit suitable for the conditioning and processing of the electrical signal supplied by the MEMS microphone. The entire component is simple to produce and has a compact and space-saving construction. Production is accomplished in a simple and reliable manner.

7 Claims, 5 Drawing Sheets

MICRO ELECTRO MECHANICAL SYSTEM (MEMS) MICROPHONE HAVING A THIN-FILM CONSTRUCTION

RELATED APPLICATIONS

This is a U.S. national stage of application No. PCT/EP2005/010974, filed on Oct. 12, 2005.

This patent application claims the priority of German patent application no. 10 2004 058 879.1 filed Dec. 6, 2004, the disclosure content of which is hereby incorporated by reference.

FIELD OF THE INVENTION

The invention relates to a microphone of MEMS design (Micro Electro Mechanical System) which can be produced as a miniaturized component by means of thin-film methods on the surface of a substrate.

BACKGROUND OF THE INVENTION

A microphone of MEMS design is known from U.S. Pat. No. 5,490,220 A by way of example. In order to produce such a microphone, a thin-film construction is produced on a substrate, said thin-film construction comprising at least one diaphragm which is embedded into the thin-film construction and, in a later method step, is freed from its embedding by virtue of the layers that envelope or enclose being removed by etching.

In this case, the functional principle is based on a capacitor having a capacitance that varies with the vibrating diaphragm. Accordingly, alongside the diaphragm a further conductive layer is also provided as counterelectrode, which can be realized within the same layer construction.

The signal processing of such an MEMS microphone requires integrated circuits in the form of semiconductor components, known MEMS microphones typically being incorporated into a common package and thus constituting hybrid components. A further possibility consists in integrating an MEMS microphone together with an IC component in a module. In all cases, however, microphones are obtained which require a relatively large silicon or semiconductor area and which can therefore be housed or incorporated into a package only in a complicated manner.

SUMMARY OF THE INVENTION

Therefore, it is an object of the present invention to specify a microphone of MEMS design which has a compact construction and is simple to produce.

This and other objects are attained in accordance with one aspect of the invention directed to a microphone of MEMS design having a thin-film construction, which is applied on a carrier plate and comprises at least one electrically conductive diaphragm arranged such that it vibrates freely on both sides in a free volume. A conductive layer is arranged at a distance from the diaphragm, said conductive layer forming a capacitor together with the diaphragm. The carrier plate in turn is mechanically fixedly connected to an IC component comprising an integrated circuit, said carrier plate being seated on said component. The capacitor formed from diaphragm and conductive layer is electrically connected to the integrated circuit.

The connection between carrier plate and IC component is preferably a wafer bonding connection. This permits an integrated circuit fabrication of the MEMS microphone together with the IC component at the wafer level. The component thus obtained is compact and readily handleable. Since the IC component practically constitutes a baseplate of the microphone, the mechanically sensitive parts, in particular the diaphragm of the microphone, are largely protected with this form of the arrangement. No further carrier substrate is required for the microphone since the necessary stability is ensured by the IC component. At the same time, it is possible to reduce the size of the overall component such that it is smaller than the sum of separately handleable components such as the micromechanical component and the IC component. This enables further miniaturization and, associated with this, a saving of costs.

In one preferred embodiment, both the diaphragm and the electrically conductive layer are formed from doped polysilicon. An electrically conductive diaphragm requiring no additional conductive coating is thus obtained in a simple manner. The mechanical properties of polysilicon are well suited to the desired purpose of use as a diaphragm. Moreover, polysilicon can be produced in a simple manner with desired modification in a controlled method.

The electrical connection between the diaphragm, the conductive layer and the corresponding connections on the surface of the IC component can be effected via bonding wires that connect metalized contacts on the surface of the MEMS microphone and corresponding uncovered contacts on the surface of the IC component.

In this embodiment, the carrier plate may comprise any crystalline, ceramic or other hard material that can serve as a basis for the thin-film construction. Preferably, however, the carrier plate comprises a material which can be produced and patterned using standard methods of microsystems technology or microelectronics that are known per se. The carrier plate is therefore preferably made of silicon. It is also possible, however, to fabricate said carrier plate from glass, some other semiconductor or some other crystalline substrate.

In a second embodiment, the microphone according to the invention has no bonding wires. Rather, the layer construction is arranged on a carrier plate which is established in electrically conductive fashion and is electrically conductively connected to diaphragm and conductive layer, on the one hand, and also to the connection areas at the IC component, on the other hand. Electrically conductive connections are provided through corresponding patterning of the carrier plate, and constitute two connections that are electrically isolated from one another for the capacitor forming the microphone.

The electrically conductive connection between diaphragm and electrically conductive carrier plate, on the one hand, and between electrically conductive layer and carrier plate, on the other hand, may be formed by polysilicon structures integrated in the thin-film construction.

In the microphone according to an embodiment of the invention, the diaphragm is arranged above a cutout of the carrier plate. The diaphragm is covered toward the top with a rigid cover layer which is arranged at a distance from it and is coated with the conductive layer preferably on the inner side and has sound entry openings. The diaphragm is fixedly connected to the thin-film construction preferably only via its electrical lead. In the remaining region, the diaphragm can bear freely on the carrier plate. The diaphragm is held at a desired distance from the cover layer and thus from the electrically conductive layer by means of suitable spacer structures.

This loose mounting of the diaphragm on the one hand avoids production-dictated stresses in the diaphragm, and on the other hand enables the diaphragm to readily start vibrating under the action of sound waves. The cover layer is formed in integrated fashion in the thin-film construction and protects the mechanically sensitive diaphragm from above. The sound entry openings therein can be formed with e.g. round openings that are small as seen relative to the area of the diaphragm.

The cutout in the carrier plate below the diaphragm enables the diaphragm to vibrate freely toward the bottom and simultaneously provides a free volume for pressure equalization. The cutout is closed off by the IC component toward the bottom.

The carrier plate is connected to the IC component by means of wafer bonding, preferably by means of a wafer bonding method which can be carried out at relatively low temperatures of e.g. less than 400 degrees Celsius. A suitable method is eutectic bonding, for example, during which, by contacting and melting two suitable different material layers, a eutectic that melts at a lower temperature than the individual materials is formed at the interface, and ensures the mechanical connection of carrier plate and IC component.

The connection between carrier plate and IC component can be effected over a large area. However, it is also possible to provide the connection only at specific locations that are distributed over the surface of the IC component in such a way that, on the one hand, both a mechanical stable connection and, on the other hand, in the variant without bonding wires, the corresponding electrical connections can be produced in a manner insulated from one another.

Doped silicon is preferably used as electrically conductive material for the carrier plate. This has the advantage that with the use of an IC component made of silicon, identical materials can be connected by means of the wafer bonding, thereby minimizing production-dictated thermal strains between IC component and carrier plate.

A preferred connection between carrier plate and IC component is effected by means of a eutectic formed from silicon and gold. However, other eutectics are also suitable as connecting materials which have the necessary electrical conductivity. Likewise, other connection technologies are also suitable, in principle. For the embodiment according to the invention with bonding wires, a number of further materials are suitable for producing the connection between carrier plate and IC component.

The IC component comprises at least one integrated circuit suitable for the conditioning and processing of the electrical measurement signals supplied by the microphone. Accordingly, there is realized in the IC component a circuit that supplies an output signal dependent on the capacitance of the capacitor formed by the microphone. This may be a current dependent on the capacitance or preferably a voltage dependent on the capacitance. In this case, the integrated circuit can generate the output signal in e.g. linear or arbitrary other dependence on the measurement signal.

The IC component may also comprise an analog-to-digital converter, with the result that the measurement signal supplied via the variable capacitance can be output as a digital output signal by the IC component. An amplifier may additionally be integrated in the IC component, said amplifier making it possible to pass the output signal of the IC to a loudspeaker for example directly without interposition of a further amplifier. However, it is also possible to feed the output signal to a storage medium or a data line.

BRIEF DESCRIPTION OF THE DRAWINGS

The invention and in particular the production method for the microphone according to the invention are explained in more detail below on the basis of exemplary embodiments and with reference to the associated figures.

The figures serve solely for illustrating the invention and have therefore been elaborated only in a schematic fashion and not in a manner true to scale. Identical or identically acting parts are designated by identical reference symbols.

DETAILED DESCRIPTION OF THE DRAWINGS

Figure 1:
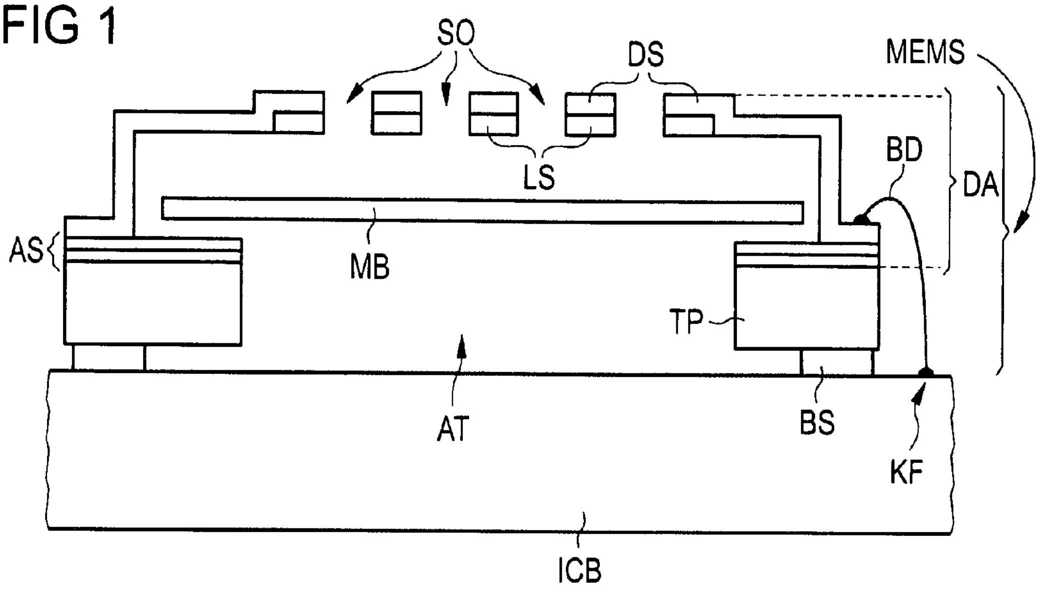
FIG. 1 shows a first exemplary embodiment on the basis of a schematic cross section.

FIG. 1 shows a first simple exemplary embodiment of the invention in a highly diagrammatic and simplified illustration. In terms of its construction, the microphone is subdivided into an MEMS part, which is fabricated separately as an MEMS component, and into the IC component ICB. The fundamentally known MEMS construction for the microphone is arranged on a carrier plate TP, on which a thin-film construction is firstly produced with the aid of microprocess-technological standard methods by deposition of standard materials and subsequent patterning. Said thin-film construction comprises at least one electrically conductive diaphragm MB produced in the thin-film construction between two sacrificial layers that are removed in a later method stage.

A cover layer DS is arranged at a distance from the diaphragm, and carries a conductive layer LS. The conductive layer LS is preferably arranged below the cover layer DS. The cover layer may be, as illustrated, part of an encapsulation that is seated on the carrier plate TP and covers the diaphragm from above. A corresponding clearance is realized above and below the diaphragm and ensures unimpeded displacement of the diaphragm. For this purpose, a cutout AT reaching through the entire carrier plate is provided below the diaphragm. A free spacing is also complied with between diaphragm and cover layer covered with conductive layer.

The diaphragm itself can bear above the cutout in the entire edge region on the carrier plate TP and is fixed there, however, at least one point. Apart from that, the diaphragm can bear freely on the carrier plate.

Due to the dictates of production, the topmost layer of the carrier plate TP is an etching stop layer, which may also be a double layer composed of oxide and nitride, for example. Sound entry openings SO, for example holes having a round or angular cross section, are provided in the cover layer and the conductive layer in a manner located above the cutout, that is to say centrally above the diaphragm. The sound entry openings serve for the entry of sound and for pressure equalization and are preferably distributed uniformly in the cover layer DS in the region of the diaphragm.

The carrier plate in turn is fixedly connected to an IC component ICB, for example with the aid of bonding structures BS, which may be applied as a peripheral frame on the surface of the IC component ICB and on which the carrier plate is seated with its edge region.

However, it is also possible for the entire (plane) underside of the carrier plate to be connected to the surface of the IC component ICB with the aid of bonding structures. The bonding structures are preferably produced by means of a wafer bonding method and comprise for example an adhesive layer or, as already explained, a eutectic, for example a silicon/gold eutectic. However, other bonding structures BS are also suitable. When using other bonding methods, it is also possible to connect similar materials, or materials of identical type, of carrier plate and surface of the IC component by means of a bonding technique without bonding structures being formed in the process.

The IC component contains at least one integrated circuit, serving for the conditioning and processing of the measurement signal supplied by the microphone. The electrical connection of the two electrodes of the microphone capacitor, that is to say of the electrically conductive diaphragm and of the electrically conductive layer LS, is effected by means of bonding wires BD in this exemplary embodiment. For this purpose, both the diaphragm and the conductive layer, at a location not illustrated in the figure, are conducted out onto the surface of the layer construction or uncovered at a suitable location and are connected there to a bonding wire BD. The other end of the bonding wire is connected to the corresponding contact areas on the surface of the IC component.

In the exemplary embodiment illustrated, a silicon wafer is used as the carrier plate, said silicon wafer also being thinned prior to application to the IC component. Alongside the etching stop layer, the thin-film construction comprises the diaphragm and the conductive layer, which are in each case formed from polysilicon. The cover layer and the encapsulation into which the cover layer is integrated are preferably formed from silicon nitrite. Moreover, other patternable crystalline, ceramic or glass materials are also suitable for the carrier plate provided that they can be machined by micropatterning methods.

Figure 2:
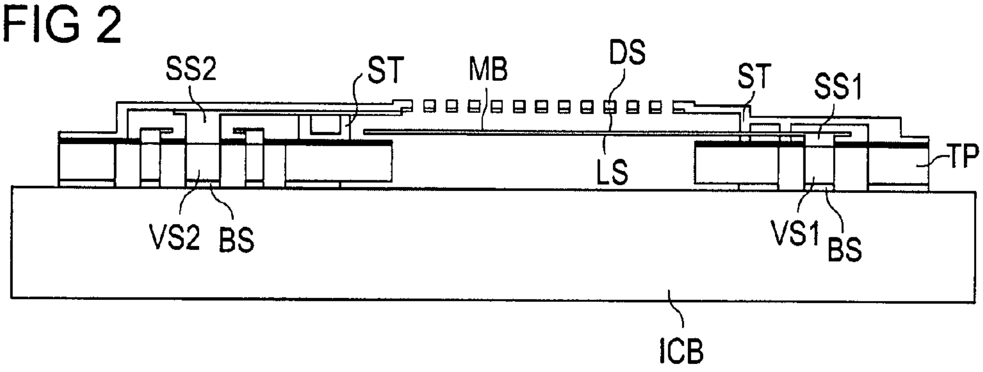
FIG. 2 shows a second exemplary embodiment in cross section.

FIG. 2 shows a further exemplary embodiment, in which, in contrast to the first exemplary embodiment, the electrical connection between diaphragm, conductive layer and IC component is effected via a carrier plate TP established in electrically conductive fashion. The figure illustrates two vertical connecting structures VS1 and VS2 for electrical linking to the conductive layer LS and to the diaphragm MB, respectively. The electrically conductive connection between the carrier plate and, if appropriate, a plurality of conductive layers is effected by polysilicon structures SS1 and SS2, respectively, which are concomitantly produced in integrated fashion in the thin-film construction and in this case are embedded in insulating oxide.

The connecting structures VS1 and VS2 are electrically isolated from one another and patterned from the material of the carrier plate. In this case, it is possible for only one of these two connecting structures to be produced separately and for the entire remaining region of the carrier plate TP to be used as the second connecting structure. Accordingly, the connecting structure can take up an arbitrary basic area in the carrier plate TP. The figure illustrates two connecting structures that are in each case inherently insulated. Subsequent wire bonding is no longer required for the contact-connection owing to the electrically conductive bonding structures BS produced in the bonding method. FIG. 2 additionally illustrates supporting structures ST composed of the material of the cover layer, in particular, which supporting structures support the mechanical stability of the entire thin-film construction.

Figure 3:
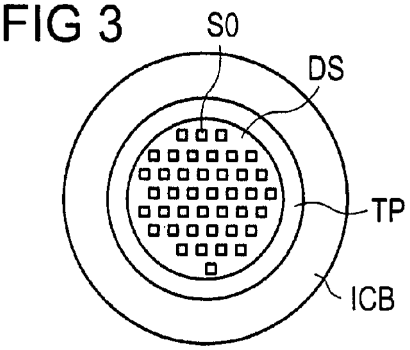
FIG. 3 shows a component in schematic plan view.

FIG. 3 shows essential components of a microphone according to the invention in a schematic plan view. In accordance with the figure, the carrier plate TP remaining after the production of the cutout is patterned in the form of a frame having a round opening. The diaphragm bearing thereon can vibrate freely within the frame. Above the cutout AT enclosed by the frame, the sound openings SO are arranged within the cover layer.

The external dimensions of the IC component ICB can be designed as desired if only, at a side, a margin of ICB exceeds the carrier plate TP, so that the external contacts of the IC component ICB can be arranged there. An extremely space-saving arrangement is thus obtained overall. By utilizing the IC component as a mechanically stabilizing element for the MEMS construction, the component according to the invention is extremely space-saving compared with a mere combination of IC component and MEMS microphone, for example in a manner arranged or integrated on a common substrate or module, and also exhibits particularly low losses owing to the short electrical connections.

FIGS. 4A to 4J show, on the basis of schematic cross sections, various method stages in the production of a microphone according to the invention in accordance with the second exemplary embodiment as is illustrated in FIG. 2.

Figure 4A:
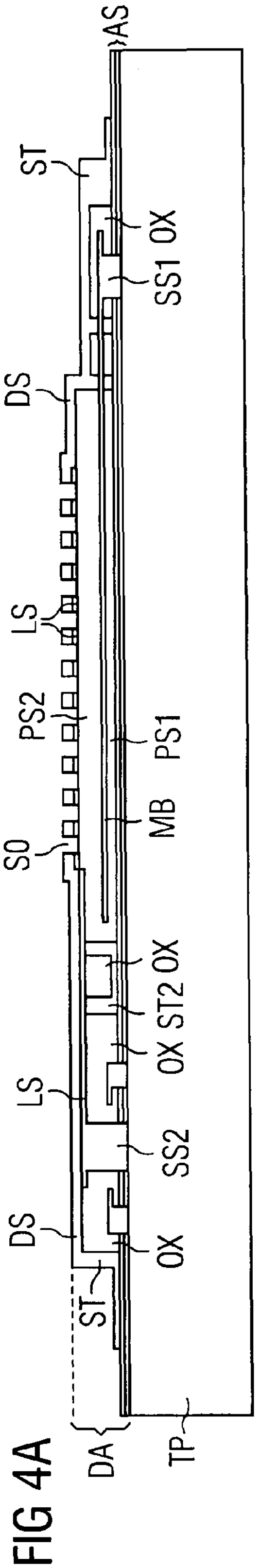
FIGS. 4A to 4J show different method stages in the production of a microphone according to the invention.

FIG. 4A shows the MEMS component with a still compact thin-film construction DA directly after depositing and patterning of the corresponding layers. For this purpose, an etching stop layer AS is applied as a double layer comprising an oxide layer and a nitrite layer on the surface of the carrier plate TP. At least two openings are provided in the etching stop layer AS, in which openings the polysilicon structures SS1 and SS2 can make contact with the surface of the electrically conductive carrier plate, in particular a doped silicon wafer. The polysilicon structures are produced for example by filling corresponding openings in the layer construction. Furthermore, the thin-film construction DA comprises at least one lower buffer layer PS1 between the etching stop layer and the diaphragm MB and also an upper buffer layer PS2 between the diaphragm and the cover layer DS. Supporting structures ST are provided peripherally around that region of the diaphragm MB which vibrates freely later, said supporting structures being constructed from the same material as the cover layer DS, in particular from silicon nitride.

In the central region of the diaphragm MB, there is arranged on the upper buffer layer PS2 the conductive layer and finally, in wholly covering fashion, the cover layer DS. Sound entry openings SO, in which the oxide of the buffer layer PS2 is uncovered, are also produced there by patterning of cover layer and conductive layer LS. The polysilicon structures SS1 and SS2. arranged in the edge region of the thin-film construction are likewise embedded in oxide OX and covered by the cover layer DS applied in large-area fashion. A large-area wafer is preferably used as the carrier plate, on which wafer a multiplicity of further constructions of identical type are produced simultaneously and in parallel with the MEMS construction illustrated and are singulated at a later stage.

Figure 4B:
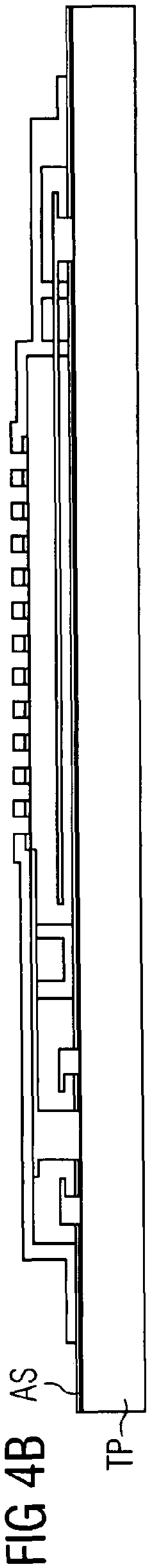

In the next step, the wafer forming the carrier plate can be thinned, preferably by a mechanical layer removal method, in particular by grinding and/or etching. This is possible since the compact layer construction DA increases the mechanical stability of the wafer of the carrier plate. FIG. 4B shows the arrangement after thinning.

Figure 4C:
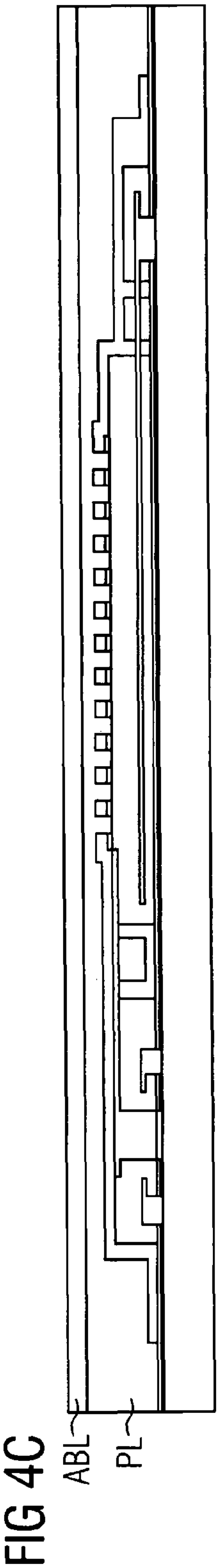

In the next step, a planarization layer PL may optionally be applied over the whole area and be planarized, if appropriate. This may be for example a resist layer or a resin that is preferably to be applied in liquid form, for example an epoxy resin. A release film ABL is subsequently applied as an intermediate layer on the plane surface of the planarization layer PL. Said release film fulfils two functions. Firstly, it serves to produce the connection to an auxiliary wafer HW, and secondly it serves as a release film enabling the auxiliary wafer HW to be easily released in a later step. By way of example, the release film ABL is an adhesive film onto which an auxiliary wafer HW is adhesively bonded. FIG. 4C shows the arrangement after this step.

Figure 4D:
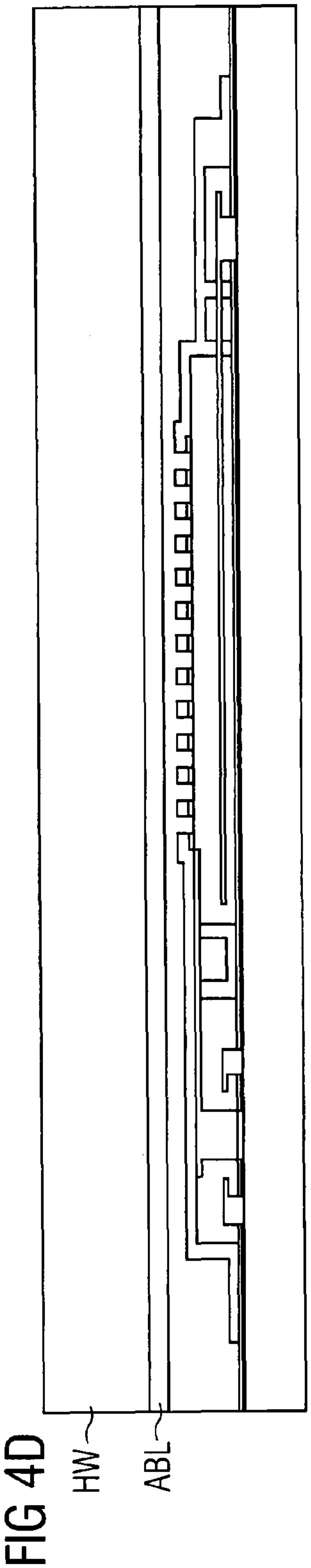

FIG. 4D shows the construction already connected to the auxiliary wafer HW, the strength and adhesion of which construction can be reinforced by corresponding contact pressure and, if appropriate, by increasing the temperature during the adhesive bonding. The auxiliary wafer HW serves solely for better handling of the construction and for stabilizing the system, which becomes mechanically more sensitive as a result of the later patterning. Therefore, said wafer may comprise an arbitrary mechanically stable material that withstands the machining steps undamaged and does not exhibit any interactions with the methods mentioned. The auxiliary wafer may therefore be for example a glass plate, a further silicon wafer or any other solid material. In principle, however, no auxiliary wafer and therefore also no planarization layer are required for the method.

In one possible variant of the production method according to the invention, the carrier plate TP is not thinned until after the application of the auxiliary wafer, with the result that the stability of the construction is increased during the thinning method, thus enabling the carrier plate TP (wafer) to be thinned to a smaller layer thickness.

Figures 4E, 4F, 4G:
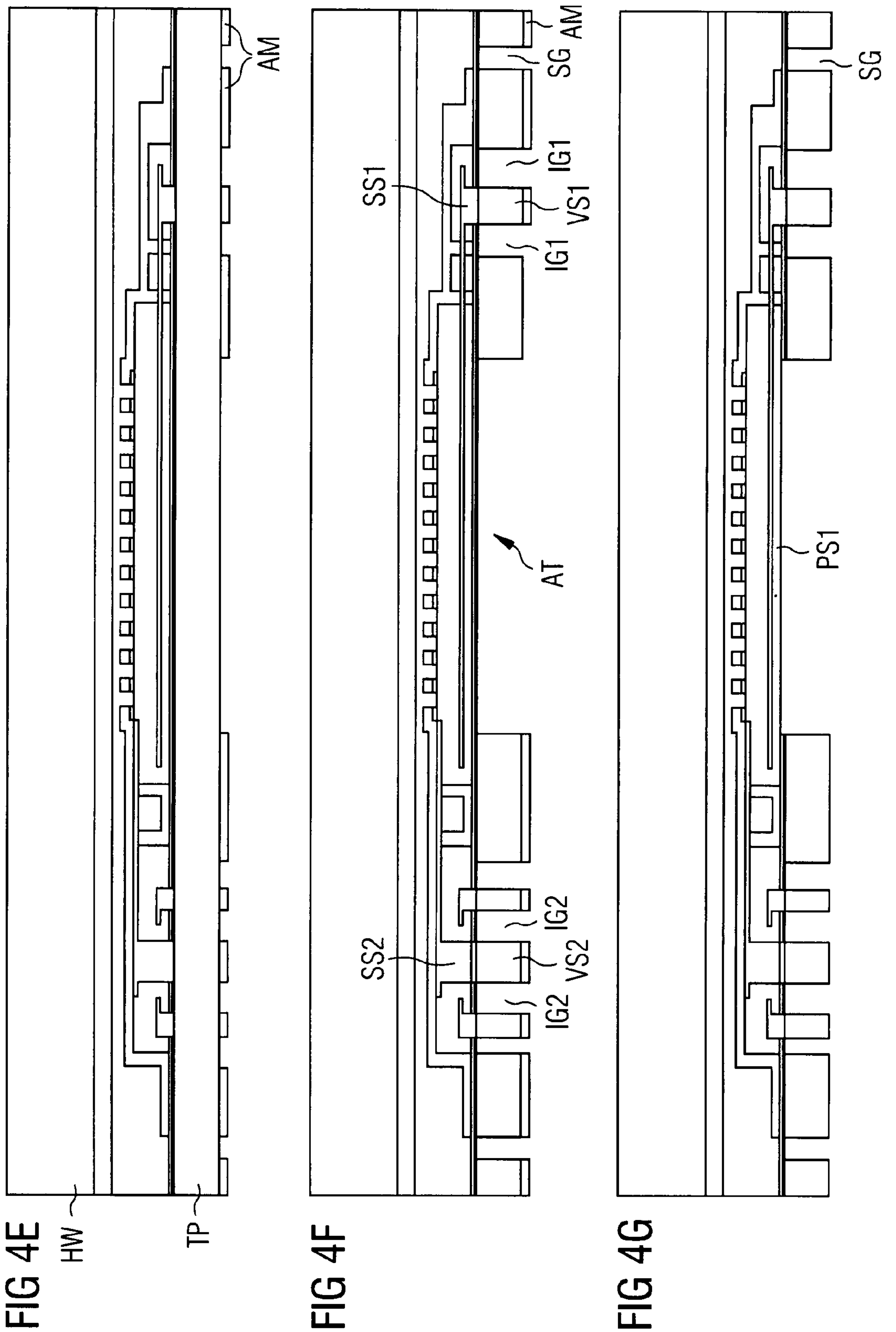
Figure 4H:
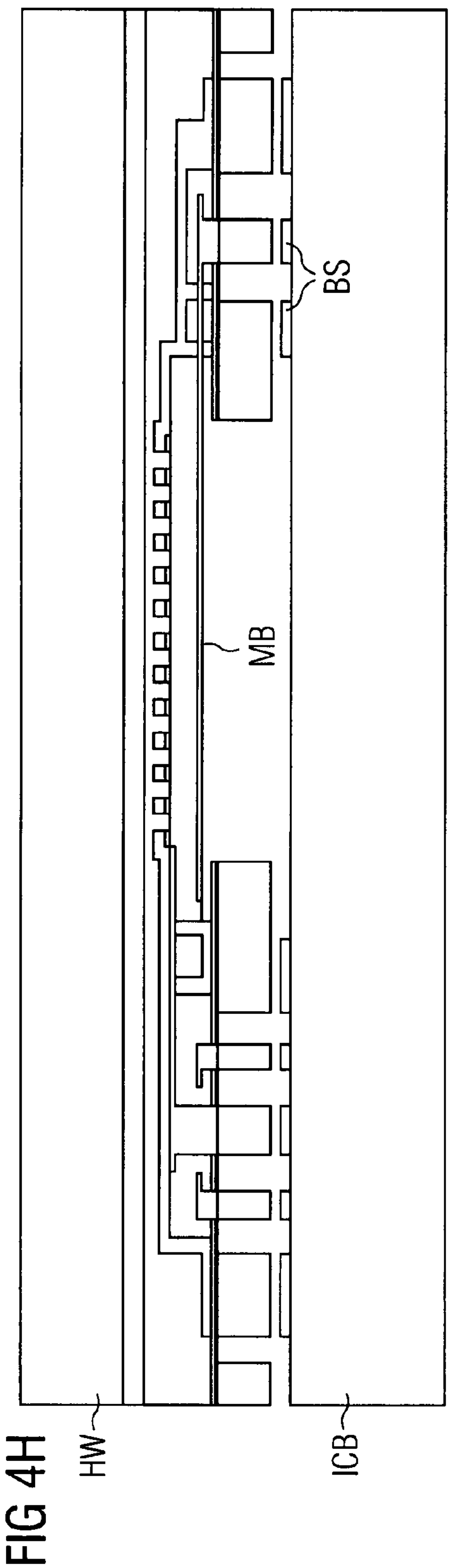

The carrier plate TP is patterned in the next step. For this purpose, an etching mask AM is applied on the underside of the carrier plate and patterned, for example an etching mask composed of resist or a hard mask that is patterned by means of a photoresist. FIG. 4E shows the construction with etching mask AM.

The silicon material of the carrier plate TP is then etched in the regions not covered by the etching mask AM, preferably by means of deep reactive ion etching (DRIE). The bottommost layer of the thin-film construction, the etching stop layer AS, stops the process selectively as soon as it is uncovered in the openings. This patterning is used to form both the cutout AT below the central region of the diaphragm and isolating trenches IG1 and IG2 by means of which the vertical connecting structures VS1 and VS2 are isolated from the rest of the carrier plate TP. Furthermore, in this patterning step it is possible to produce a patterning trench SG that runs annularly around each individual microphone and completely separates the carrier plate there as early as at this stage. This has the advantage that the individual MEMS microphones can be singulated by means of micropatterning technology and thus significantly more simply and more precisely than with the sawing methods that are customarily used for singulation. FIG. 4F shows the arrangement in which the etching stop layer AS is uncovered in the region of the cutout AT.

FIG. 4G shows the arrangement after the etching mask AM has been removed for example by stripping or etching away. The lower buffer layer PS1 is subsequently removed by etching. The diaphragm is uncovered at the underside in the process.

Figure 4I:
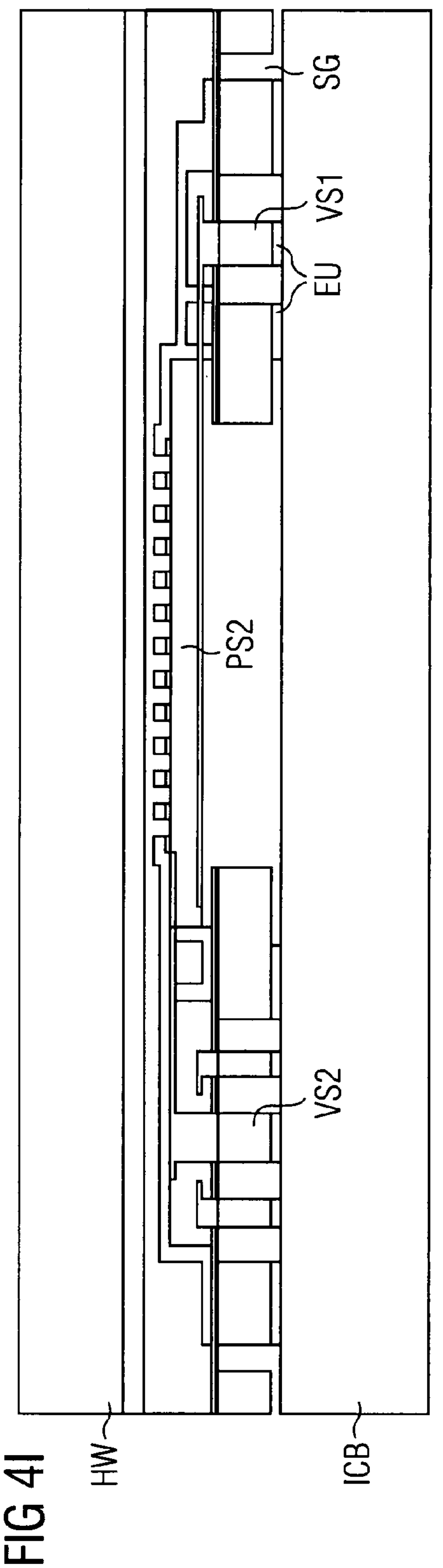
Figure 4J:
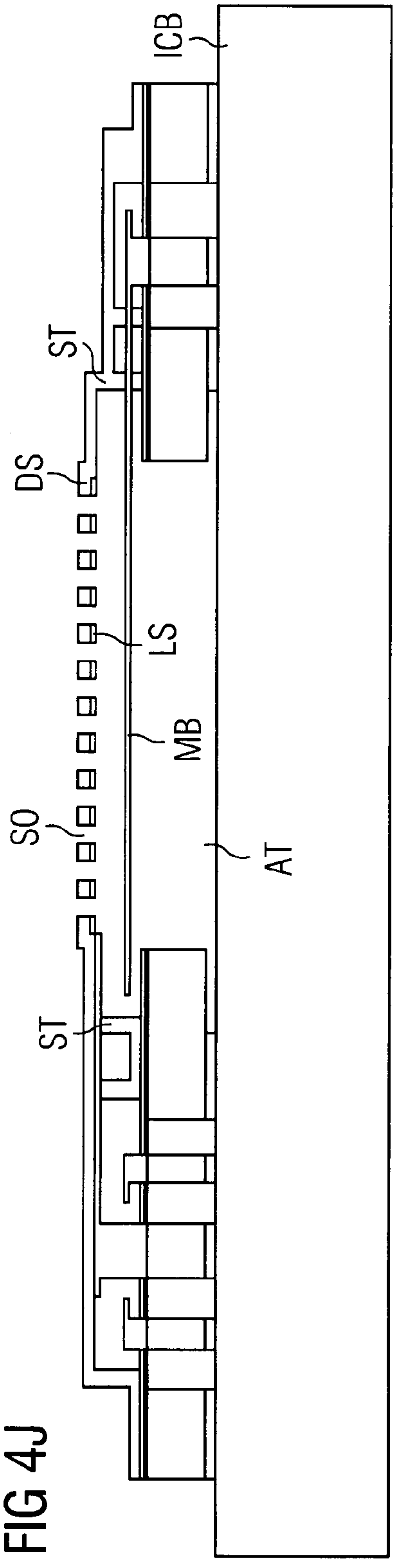

The next step involves connecting the previously produced MEMS construction to an IC component in a wafer bonding method. For this purpose, bearing and contact structures (see FIG. 4H) are preferably produced on the surface of the IC component, said structures ensuring the mechanical and electrical connection to the carrier plate. In the case of eutectic wafer bonding that is preferably used, this is a bonding structure BS which is suitable for forming a eutectic with the material of the carrier plate TP. The IC component ICB is also made available as a component array at the wafer level with a component distribution corresponding to the MEMS constructions in the wafer. The carrier plate is then placed onto the bonding structures in an accurately fitting manner and connected by temperature increase and pressure, the eutectic being formed in the preferred embodiment. FIG. 4I shows the arrangement after wafer bonding.

After the wafer bonding method, the bonding structures BS are converted into a eutectic EU which has electrically conductive properties and, in particular, produces an electrically conductive contact between the contact area (not illustrated) on the surface of the IC component ICB and the vertical connecting structures VS1 and VS2, and thus ensures the electrical linking of diaphragm and conductive layer to the IC component via the structures mentioned.

It can furthermore be seen from FIG. 41 that parts of the patterned carrier plate are not in direct contact with bonding structures or with the IC component, such that an interspace remains in this region. This is illustrated for the regions of the carrier plate which lie outside the component regions that are surrounded by the structure trenches SG. Each area that is occupied by one of the separate microphone units is limited by a structure trench that belongs to this area. Thus, the trenches SG do not form common limits of two contiguous microphone areas, but each trench is provided for only one of the microphones. This means that there are also areas between the areas of two neighboring microphones and that a structure trench forms the boundry between an area of a microphone on one side and an interspace on the other side of the trench. The regions of the interspace are waste and are completely removed when the microphone units are singulated.

In the next step, the auxiliary wafer HW, which has now become superfluous, is removed, the release properties of the release film ABL being utilized. The latter is constituted for example in such a way that it releases when heated to a specific temperature and thus also enables the auxiliary wafer HW to be released in a simple manner. Residues of the film can then be removed. The planarization layer can be stripped using a solvent. As can be seen from FIG. 4I, as a result the regions of the carrier plate which lie between the structure trenches SG are concomitantly removed and the MEMS constructions of the microphone units are thus singulated and only held together by the continuous wafer of the IC component. At this stage it is then possible also to singulate the individual units of the IC component, in particular by sawing. In this case, it is advantageous that the diaphragm at this stage is still fixedly connected to the remaining thin-film construction by the upper buffer layer PS2 and therefore also cannot be damaged by the vibrations arising during the sawing process.

The further processing is then effected on the basis of singulated components. Through the sound entry openings SO that are then accessible from above, the upper buffer layer PS2 can then be stripped out by etching. This may be effected for example with the aid of highly concentrated hydrofluoric acid (HF fume). In this case, the cavity between cover layer DS and diaphragm MB which is laterally delimited by supporting structures ST is completely opened, with the result that the diaphragm can vibrate freely into this cavity. The freedom to vibrate downward has already been ensured, after all, by the cutout AT in the central region of the diaphragm. The diaphragm nevertheless remains protected by the cover layer, which has only small sound entry openings SO, and thus protected against mechanical damage.

Since the diaphragm at least partly bears only loosely on the carrier plate TP, pressure equalization is also possible between the cutout AT and the upper clearance between diaphragm and cover layer, likewise naturally toward the outside through the sound entry openings SO. The microphone according to the invention is now completed after this step and corresponds to the component illustrated in FIG. 2.

The embodiment in accordance with FIG. 1 is produced in an analogous manner, but with significantly less complicated method steps. For this exemplary embodiment, a thin-film construction DA comprising only a respective polysilicon layer for diaphragm and conductive layer LS is produced on a carrier plate TP. What is essential is that the polysilicon layer is embedded between an upper and a lower buffer layer, in particular an oxide layer, which enables mechanical fixing of the sensitive diaphragm during production. During the patterning of the carrier plate, it is then necessary only to produce the cutout AT, preferably additionally also the patterning trenches for mechanically singulating the MEMS construction. The lower buffer layer below the diaphragm is removed prior to the connection of the carrier plate to the IC component, whereas the upper buffer layer between cover layer and diaphragm is not removed until after the singulation of the components, in order that the diaphragm is still protected mechanically during this step as in the exemplary embodiment described above. In this case, too, for the patterning of the carrier plate and in particular for the thinning thereof, it is possible to use an auxiliary wafer for mechanical stabilization.

Both production variants succeed in producing the polysilicon diaphragm MB and also the cover layer made of silicon nitride in a stress-free fashion in low-stress layer producing processes that meet the high requirements made of the residual stress of these layers in MEMS microphones. The footprint, that is to say the area requirement of microphones according to the invention, can be reduced by up to a factor of two compared with known components. This is also associated with correspondingly smaller packing sizes and packages.

Although the invention has only been explained on the basis of a few exemplary embodiments, it is not, of course, restricted to them. What is regarded as essential to the invention, however, for the component, is the compact design and also the basic order of the production steps.

In particular the production and construction of the MEMS structures, which are inherently known in principle per se, are not restricted to the exemplary embodiments explained. The integrated contact-connection of the microphone via the carrier plate established in conductive fashion and vertical connecting structures formed from a carrier plate established in conductive fashion is also illustrated only by way of example, but can be varied as desired by a person skilled in the art in a simple manner. The invention is also not restricted with regard to the dimensions of microphones according to the invention. The processes illustrated succeed in producing microphones having a diameter of approximately 500 to 700 μm, the diaphragm of which has a thickness of approximately 1 μm. In principle, it is possible to reduce the size of the microphone further, although electrical losses with regard to the measurement signal and thus with regard to the electrical properties of the microphone have to be accepted. The method specified can also be used to produce larger microphones.

The invention can also be varied with regard to the materials used for the thin-film construction DA. Thus, by way of example, all the oxide layers can be replaced in a simple manner by suitable polymers or, given a corresponding construction, by a sacrificial polysilicon. The silicon nitride used for the cover layer can be replaced by any other mechanically stable material which can be etched selectively with respect to oxide. For the wire-bonded variant in accordance with FIG. 1, further variation possibilities arise with regard to the materials for the carrier plate. Variants are also possible with regard to the auxiliary wafer. Moreover, the invention is not restricted to a specific IC component, and can also be varied with regard to the circuit functions provided by the IC component. The processing steps used for the patterning are also not restricted to the processes specified and can be replaced by corresponding processes that act identically. The singulation of the components, in particular the separation of the carrier plate, can alternatively also be effected mechanically or by means of a laser, as can the singulation of the IC component from the corresponding semiconductor wafer.

The scope of protection of the invention is not limited to the examples given hereinabove. The invention is embodied in each novel characteristic and each combination of characteristics, which includes every combination of any features which are stated in the claims, even if this feature or combination of features is not explicitly stated in the examples.

The invention claimed is:

1. A micro electro mechanical system (MEMS) microphone comprising:
- a thin-film construction on an electrically conductive carrier plate, the thin-film construction comprising:
  - an electrically conductive diaphragm configured to vibrate in a free volume; and
  - a conductive layer arranged at a distance from said electrically conductive diaphragm, said conductive layer forming a capacitor with the electrically conductive diaphragm, the electrically conductive carrier plate being mechanically fixedly connected to an integrated circuit (IC) component comprising an integrated circuit; and the electrically conductive diaphragm and the conductive layer being electrically connected to the integrated circuit in the IC component;
- wherein electrically conductive connections are formed by which the electrically conductive diaphragm and the conductive layer are electrically connected to the integrated circuit via the electrically conductive carrier plate.

2. The microphone as claimed in claim 1, wherein the electrically conductive diaphragm and the conductive layer are formed from polysilicon.

3. The microphone as claimed in claim 1, wherein the electrically conductive diaphragm and the conductive layer are electrically connected to the integrated circuit via bonding wires.

4. The microphone as claimed in claim 1, wherein the electrically conductive connections are embodied within the thin-film construction by polysilicon, and wherein the electrically conductive carrier plate and polysilicon are patterned to enable a mutually insulated electrical linking of the electrically conductive diaphragm and the conductive layer to corresponding contact areas on a top side of the IC component, the mechanical and electrical connection of the electrically conductive carrier plate and IC component being effected via the same connecting locations.

5. The microphone as claimed in claim 1, wherein the electrically conductive carrier plate includes a cutout below the electrically conductive diaphragm; and wherein a rigid cover layer is arranged above the electrically conductive diaphragm at a distance from the electrically conductive diaphragm, said rigid cover layer being coated with the conductive layer and having sound entry openings.

6. The microphone as claimed in claim 1, wherein the mechanical and electrical connection of the electrically conductive carrier plate and IC component is ensured by an electrically conductive silicon/gold eutectic.

7. The microphone as claimed in claim 1, wherein the IC component comprises an integrated circuit for conditioning and processing of electrical signals of the capacitor formed by the electrically conductive diaphragm and the conductive layer.

* * * * *